United States Patent
Hoshi et al.

(10) Patent No.: US 6,764,548 B2
(45) Date of Patent: Jul. 20, 2004

(54) APPARATUS AND METHOD FOR PRODUCING SILICON SEMICONDUCTOR SINGLE CRYSTAL

(75) Inventors: Ryoji Hoshi, Fukushima (JP); Takahiro Yanagimachi, Fukushima (JP); Izumi Fusegawa, Fukushima (JP); Tomohiko Ohta, Fukushima (JP); Yuuichi Miyahara, Takefu (JP); Tetsuya Igarashi, Takefu (JP)

(73) Assignee: Shin-Etsu Handotai Co., Ltd., Tokyo (JP)

(*) Notice: Subject to any disclaimer, the term of this patent is extended or adjusted under 35 U.S.C. 154(b) by 9 days.

(21) Appl. No.: 10/204,278
(22) PCT Filed: Oct. 26, 2001
(86) PCT No.: PCT/JP01/09434
§ 371 (c)(1),
(2), (4) Date: Aug. 20, 2002
(87) PCT Pub. No.: WO02/36861
PCT Pub. Date: May 10, 2002

(65) Prior Publication Data
US 2003/0089300 A1 May 15, 2003

(30) Foreign Application Priority Data
Oct. 31, 2000 (JP) .......................... 2000-333747

(51) Int. Cl.[7] .................. C30B 35/00; C30B 15/20
(52) U.S. Cl. .................... 117/217; 117/13; 117/218; 117/222
(58) Field of Search .............. 117/13, 217, 218, 117/222

(56) References Cited

U.S. PATENT DOCUMENTS 5,575,847 A    11/1996    Kuramochi et al. ........ 117/210
6,579,363 B2 *  6/2003    Kawanishi et al. ......... 117/213

FOREIGN PATENT DOCUMENTS

| EP | 4442239 | 11/1996 |
| JP | H06-287098 | 10/1994 |
| JP | H07-165487 | 6/1995 |
| JP | H10-167890 | 5/1998 |

OTHER PUBLICATIONS

International Search Report for PCT/JP01/09434 dated Dec. 18, 2001.

* cited by examiner

Primary Examiner—Felisa Hiteshew
(74) Attorney, Agent, or Firm—Rader, Fishman & Grauer PLLC

(57) ABSTRACT

The present invention provides an apparatus and a method for producing a silicon semiconductor single crystal which can stabilize and homogenize an amount of precipitated oxygen in the direction of the crystal growth axis when growing a silicon semiconductor single crystal. The apparatus for producing a silicon semiconductor single crystal by the Czochralski method comprises a main growth furnace having a crucible retaining silicon melt disposed therein for growing a silicon semiconductor single crystal, and an upper growth furnace for housing therein and cooling the silicon semiconductor single crystal pulled from the silicon melt, wherein the upper growth furnace communicated to a ceiling section of the main growth furnace is provided with an upper insulating member for surrounding a pulled silicon semiconductor single crystal.

29 Claims, 6 Drawing Sheets

APPARATUS AND METHOD FOR PRODUCING SILICON SEMICONDUCTOR SINGLE CRYSTAL

TECHNICAL FIELD

The present invention relates to an apparatus for producing a silicon semiconductor single crystal using the Czochralski method (referred to as a CZ method hereinafter), and a method for producing a silicon semiconductor single crystal with the apparatus.

BACKGROUND ART

Conventionally, in the growth of a silicon semiconductor single crystal using the CZ method, polysilicon is charged in a crucible provided in a growth furnace of an apparatus for producing a silicon semiconductor single crystal, the polysilicon is melted to silicon melt by heating the polysilicon with a heater provided around the crucible, and after a seed crystal is dipped into the melt, the seed crystal is pulled above the silicon melt while rotating it gently to grow a silicon semiconductor single crystal having a substantially cylindrical constant diameter portion. Then the pulled silicon semiconductor single crystal is cut and ground to leave the constant diameter portion, and becomes a silicon semiconductor wafer through a wafer shaping process. The thus obtained silicon semiconductor wafer is used as a semiconductor device substrate for fabricating an integrated circuit or the like on the surface layer of which is formed an electric circuit.

In the process of forming an electric circuit on the surface layer of the silicon semiconductor wafer, oxygen atoms contained in the silicon semiconductor wafer bond to silicon atoms to form oxide precipitates such as BMD (Bulk Micro Defect) inside the silicon semiconductor wafer. It is known that the oxide precipitates such as BMD capture (or getter) excess contamination atoms such as heavy metal atoms contaminated in the semiconductor device fabricating process to improve properties and yields of semiconductor devices. Therefore, by using a silicon semiconductor wafer substrate containing larger amounts of oxide precipitates such as BMD, it is possible to improve yields of semiconductor devices formed on a surface layer of the substrate.

The amount of oxide precipitates depends on a concentration of oxygen originally contained in the silicon semiconductor wafer as well as on thermal history of the silicon semiconductor wafer for a period from during the crystal growth up to just prior to the semiconductor device fabricating process. However, generally there is a standard for a concentration of oxygen contained in a silicon semiconductor wafer, which cannot be changed readily.

Also it is known that in the silicon semiconductor single crystal, even if distribution of an oxygen concentration in the direction of the growth axis is homogeneous, distribution of the amount of precipitated oxygen exists in a state where it is relatively large in the seed side of the grown crystal and is relatively small in the melt side. It is considered that this phenomenon is due to the distribution in the axial direction of thermal history in a relatively low temperature zone where nuclei of the oxide precipitates are formed and grow in the single crystal.

Then there is disclosed a technique for adjusting the thermal history to a desired value during a processing period from growing a silicon semiconductor single crystal up to manufacturing a silicon semiconductor wafer therefrom. For instance, JPA 83-120591 discloses a method of increasing oxygen precipitation by heating a silicon semiconductor single crystal during its growth to adjust the thermal history, and in JPA 90-263792, the method of annealing a silicon semiconductor single crystal after its growth and the like are examined.

In the method of heating a silicon semiconductor single crystal during its growth, however, there are required large scale reconstruction for installing a heating apparatus of heating a grown silicon semiconductor single crystal in a producing apparatus and a power for heating the grown crystal; the method cannot be regarded as an efficient method from the viewpoint of cost and operability. Further, a temperature balance during growth of a silicon semiconductor single crystal is forcibly changed, so that dislocations are created in the grown crystal, thereby the commercialization thereof being disadvantageously impossible.

On the other hand, in the method of annealing a silicon semiconductor single crystal after its growth, it is conceivable to anneal the silicon semiconductor single crystal in the ingot state or in the wafer state, but an expensive apparatus is required in either case, and in addition, running cost for the apparatus for annealing as described above is generally high, and therefore this method is inefficient in view of the production cost. Further, this method in which oxygen precipitation in a crystal is controlled by means of annealing has such troubles as contamination by heavy metals during the annealing process; so such problems persist in this method.

DISCLOSURE OF THE INVENTION

With the foregoing drawbacks of the prior art in view, it is an object of the present invention to provide an apparatus and a method for producing a silicon semiconductor single crystal which can stabilize and homogenize an amount of precipitated oxygen in the direction of the crystal growth axis when growing a silicon semiconductor single crystal.

To achieve the above described object, an apparatus for producing a silicon semiconductor single crystal according to the present invention resides in an apparatus for producing a silicon semiconductor single crystal by the Czochralski method which comprises a main growth furnace having a crucible retaining silicon melt disposed therein for growing a silicon semiconductor single crystal, and an upper growth furnace for housing therein and cooling the silicon semiconductor single crystal pulled from the silicon melt, wherein the upper growth furnace communicated to a ceiling section of the main growth furnace is provided with an upper insulating member for surrounding a pulled silicon semiconductor single crystal.

To make oxygen precipitated more in a silicon semiconductor single crystal, it is necessary to form therein nuclei for causing oxygen precipitation during crystal growth and to make the nuclei grown to large sizes. When a silicon semiconductor single crystal is subjected to heat treatment at a constant temperature, nuclei of oxide precipitates larger than the critical radius at the temperature grow to larger sizes, while those smaller than the critical radius are annihilated from inside of the silicon semiconductor single crystal. The critical radius of the nuclei of oxide precipitates becomes larger as the heat treatment temperature becomes higher. Therefore, to form BMD capable of gettering contaminants in a silicon semiconductor wafer, it is important to make the nuclei of oxide precipitates to sizes where the nuclei are not annihilated with heat treatment in the semiconductor device fabricating process. For that purpose, it is necessary to make the nuclei of oxide precipitates larger by adding heat treatment or thermal history more at a lower temperature than the heat treatment temperature in the semiconductor device fabricating process.

After a silicon semiconductor single crystal is formed in a growth furnace in a silicon semiconductor single crystal producing apparatus, the silicon semiconductor single crystal is pulled into the upper growth furnace and is allowed to cool down therein; therefore by adjusting the cooling rate at the low temperature section to a desired value, the silicon semiconductor single crystal is able to receive thermal history more to promote the formation of BMD.

To easily grow the silicon semiconductor single crystal having such quality as described above, the simple and best method is to arrange an upper insulating member for keeping warm a crystal pulled into the upper growth furnace such that the silicon semiconductor single crystal receives sufficiently thermal history at the low temperature section when the silicon semiconductor single crystal cools down. The upper insulating member may have a length almost similar to the full length of the upper growth furnace or may be arranged so as to keep warm at least about one twentieth of the full length of the upper growth furnace. When a length of the upper insulating member arranged in the upper growth furnace is less than one twentieth of the full length of the upper growth furnace, it is difficult to realize the sufficient keeping warm effect.

To sufficiently and suitably achieve the keeping warm effect for a silicon semiconductor single crystal at a low temperature area, a temperature inside the upper growth furnace communicated to the ceiling section of the growth furnace provided in the apparatus for producing a silicon semiconductor single crystal is 800° C. or less, or the upper growth furnace is arranged such that, even when a length of the upper insulating member is minimal, a temperature section of from 400° C. to 650° C. is kept warm; by adjusting the upper insulating member in such a way that thermal history of the silicon semiconductor single crystal in the above described temperature area become longer, it is possible to make the amount of precipitated oxygen larger and also to ensure stable oxygen precipitation along the full length of a crystal.

Especially, with an apparatus for producing a silicon semiconductor single crystal having the construction of the inventive apparatus, when growing a silicon semiconductor single crystal, as a first half portion of the crystal corresponding to the seed crystal side passes through the insulating member arranged in the upper growth furnace during growth of a second half portion of the crystal, it can receive sufficiently thermal history in the low temperature section; although the second half portion of the silicon semiconductor single crystal does not pass through the insulating member during growth of the single crystal, when the silicon semiconductor single crystal is pulled into the upper growth furnace and cooled down to such a low temperature as the silicon semiconductor single crystal can be taken out, the second half portion is surrounded by the insulating member of the upper growth furnace, so that the second half portion can receive sufficiently thermal history in the low temperature section like the first halt portion of the silicon semiconductor single crystal even after the crystal is separated from the silicon melt.

By taking the above described countermeasures, although there is generated a slight difference between the first half potion and the second half portion of the crystal in terms of the time when the silicon semiconductor single crystal is kept warm at a low temperature due to operating conditions for growing the silicon semiconductor single crystal or other reasons, the difference in an amount of precipitated oxygen between the first half portion and the second half portion of the crystal is substantially smaller as compared to that when the insulating member is not used; it is possible to obtain a crystal with the amount of precipitated oxygen homogenized along the full length of the crystal straight body.

Further, an amount of precipitated oxygen generated in a silicon semiconductor single crystal depends largely on the duration of thermal history in the low temperature section when the crystal is cooled down; by adjusting a length of the upper insulating member arranged in the upper growth furnace of the producing apparatus to a kind or a quality of a silicon semiconductor single crystal to be grown, it is possible to more efficiently grow a silicon semiconductor single crystal having a desired amount of precipitated oxygen. An upper insulating member in the upper growth furnace may be exchanged with one having a different length, whenever growing a silicon semiconductor single crystal, according to a crystal kind such as a diameter and a length of the silicon semiconductor single crystal to be pulled or an oxygen concentration in the crystal. Also it is preferable to provide a plurality of upper insulating members themselves piled up in the direction of the crystal growth axis in the upper growth furnace, so that the number of the upper insulating members can be changed for changing a temperature range of a lower temperature section of the crystal to be kept warm according to a desired amount of precipitated oxygen in the silicon semiconductor single crystal.

With the above described producing apparatus, it is possible to adjust suitably a temperature range width of a low temperature section of a crystal to be kept warm by changing a length of the upper insulating member arranged in the upper growth furnace; it is possible to control an amount of precipitated oxygen in the silicon semiconductor single crystal to be pulled to a desired value.

On the other hand, the upper insulating member arranged in the upper growth furnace for keeping warm the silicon semiconductor single crystal is exposed to a high temperature ranging from several hundreds c to about 800° C. even in the upper growth furnace; it is preferable to use an upper insulating member made of the materials shaped from the same carbon fiber as the insulating member for a heater or the like provided in the growth furnace for growing a silicon semiconductor single crystal. Further, in order to prevent impurities or the like out of the insulating member from flying into the growth furnace, it is desirable to cover a surface of the upper insulating member with high purity graphite materials or high purity graphite materials with a surface coated with a film of pyrolytic carbon or silicon carbide, or with metallic materials containing a metal selected from the group consisting of iron, nickel, chromium, copper, titanium, tungsten, and molybdenum as the main ingredient.

With the apparatus described above, as an amount of precipitated oxygen in a silicon semiconductor single crystal in the direction of the crystal growth axis can be stabilized almost uniformly, there is reduced variations in an amount of precipitated oxygen between individual products generated when silicon semiconductor wafers obtained from respective portions of a crystal are subjected to heat treatment of some kind such as device simulation in the next process; therefore it is possible to stabilize device quantity and production yield.

A first aspect of the method for producing a silicon semiconductor single crystal according to the present invention is to produce the silicon semiconductor single crystal by the use of the apparatus for producing a silicon semiconductor single crystal according to the present invention.

A second aspect of the method for producing a silicon semiconductor single crystal according to the present invention resides in a method for producing a silicon semiconductor single crystal by the Czochralski method, wherein the silicon semiconductor single crystal pulled from a crucible is grown keeping warm a portion thereof with a temperature of 800° C. or less without heating it from the outside.

BEST MODE FOR CARRYING OUT THE INVENTION

Embodiments of the present invention will be described below with reference to growth examples of a silicon semiconductor single crystal by the CZ method illustrated in the accompanying drawings, but it is to be noted that the present invention is not limited to these examples. For instance, an apparatus for producing a silicon semiconductor single crystal used for growing a silicon semiconductor single crystal according to the present invention can be naturally employed as an apparatus for producing a silicon semiconductor single crystal using the magnetic field applied Czochralski method (referred to as a MCZ method hereinafter) in which a single crystal is grown by applying a magnetic field to silicon melt.

Figure 1:
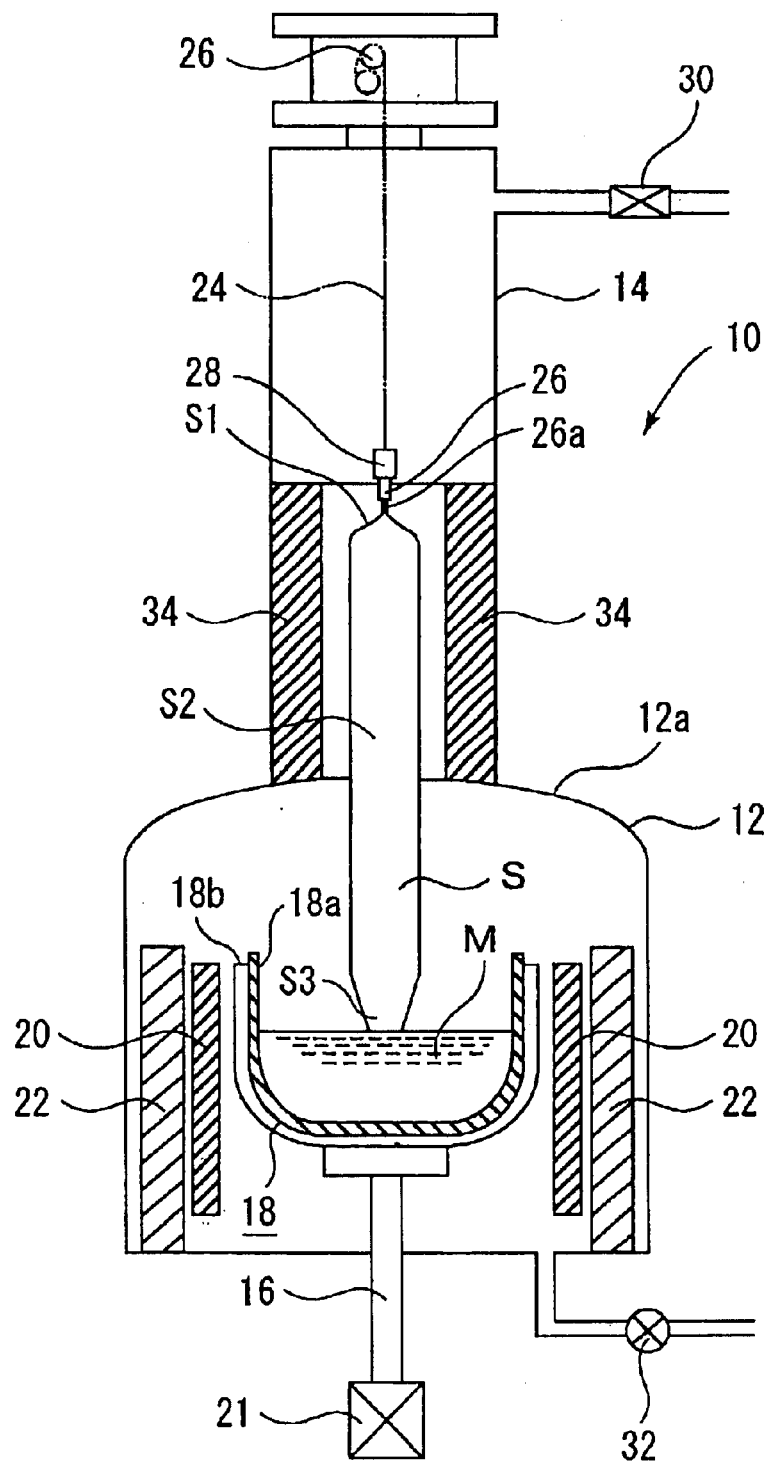
FIG. 1 is a schematic cross-sectional explanatory view showing an embodiment of an apparatus for producing a silicon semiconductor single crystal according to the present invention.

FIG. 1 is a schematic cross-sectional view showing an embodiment of an apparatus for producing a silicon semiconductor single crystal according to the present invention (may be referred to as a single crystal producing apparatus). In FIG. 1, a single crystal producing apparatus 10 comprises a main growth furnace 12 for growing a silicon semiconductor single crystal S, and an upper growth furnace 14 for housing and cooling down a silicon semiconductor single crystal pulled therein. In the center of the main growth furnace 12 a crucible 18 which has a crucible supporting shaft 16 as a shaft and is composed of a quartz crucible 18a inside and a graphite crucible 18b outside is disposed rotatably and movably up and down by a crucible driving mechanism 21 attached to a lower edge of the crucible supporting shaft 16. Silicon melt M of a starting material for growing a silicon semiconductor single crystal S is retained in the crucible 18. Further, a heater 20 made of graphite is arranged around the crucible 18. By making this heater develop heat, polysilicon charged in the crucible 18 is melted, and the silicon semiconductor single crystal S is pulled from the obtained silicon melt M. A heater insulating member 22 is provided between the heater 20 and the main growth furnace 12 to function for protecting the wall and keeping warm the inside of the main growth furnace 12.

A wire reel mechanism 26 for winding or rewinding a wire 24 which pulls the grown silicon semiconductor single crystal S is provided above the upper growth furnace 14. When growing a single crystal, the wire 24 is gradually wound up in the opposite direction of the crucible 18 while being rotated to make the crystal grown under a seed crystal 26. A seed crystal holder 28 for holding the seed crystal 26 is attached to a tip of the wire 24, and this seed crystal 26 is engaged with the wire 24 by means of this seed holder 28.

When a single crystal is grown, an inert gas such as Ar (Argon) is filled in the growth furnace and a pressure inside the furnace is adjusted to a desired value to perform the growth operation; a gas flow rate control unit 30 and a conductance valve 32 for adjusting a flow rate of the inert gas and a pressure inside the furnace respectively are provided outside the growth furnace, and thereby the flow rate and the pressure of the inert gas inside the growth furnace can be easily adjusted to growth conditions.

When a silicon semiconductor single crystal S pulled from the silicon melt M is cooled down, there is provided an upper insulating member 34 for keeping warm a low temperature area of the crystal in the vicinity of a portion of the upper growth furnace 14 communicated to a ceiling section 12a of the main growth furnace 12 so that the upper insulating member 34 surrounds the silicon semiconductor single crystal S. A characteristic construction of the inventive apparatus resides in this arrangement of the upper insulating member 34, and thereby a desired cooling down temperature area is kept warm when the silicon semiconductor single crystal S is passed therethrough.

As materials for the upper insulating member 34, insulating materials shaped from carbon fiber are used for improving the keeping warm effect. The upper insulating member is covered with a coating of stainless steel for preventing contamination inside the growth furnace to thereby inhibit flying of flocks from the carbon fiber or the like inside the growth furnace.

To make larger an amount of precipitated oxygen in the silicon semiconductor single crystal S and make smaller distribution of an amount of precipitated oxygen in the direction of the growth axis, it is preferable to provide the upper insulating member 34 at an area where a temperature in the upper growth furnace is 800° C. or less, more preferably in the range from 400° C. to 650° C. It is also effective to provide the upper insulating member 34 at an area where a temperature of a grown crystal is 800° C. or less, more preferably in the range from 400° C. to 650° C. in the upper growth furnace.

As materials used for covering the upper insulating member 34, in addition to the above described stainless steel, high purity graphite materials or high purity graphite materials with a surface coated with silicon carbide or pyrolytic carbon may be used, and also metallic materials containing metals such as nickel, chromium, copper, titanium, tungsten, molybdenum or the like may be used.

To grow a silicon semiconductor single crystal S using the single crystal producing apparatus 10 as described above, at first polysilicon is charged in the crucible 18 disposed inside the main growth surface 12 and an inert gas is filled in the furnace, and after that the polysilicon is melted by making the heater 20 develop heat with adjusting a flow rate and a pressure of the inert gas flown into the main growth furnace 12. When the polysilicon is completely melted, the crucible 18 retaining the silicon melt M is moved up and down to adjust it to a position suited for dipping the seed crystal 26 to the surface of the silicon melt M.

Then, a temperature of the silicon melt M is dropped to that suited for dipping the seed crystal 26 into the silicon melt M, and when the temperature of the silicon melt is sufficiently stabilized, by rewinding the wire 24 the seed crystal 26 is slowly dipped into the silicon melt M and then stopped; after the temperature has been stabilized, while the seed crystal 26 and crucible 18 are slowly rotated in the opposite directions, the wire 24 is gradually wound up, thus the silicon semiconductor single crystal S being grown under the seed crystal 26.

When the silicon semiconductor single crystal S is grown, at first a neck portion 26a is formed by gradually reducing the tip diameter of the seed crystal 26 to remove slip dislocations generated when the seed crystal 26 is dipped into the silicon melt M. After the slip dislocations are removed from the grown crystal, a diameter of the crystal grown under the seed crystal 26 is increased to a desired value to form a seed-cone S1 of the silicon semiconductor single crystal S. After forming the seed-cone S1, there is grown a constant diameter portion S2 with almost cylindrical shape having a desired constant diameter from which silicon semiconductor wafers are prepared. After the constant diameter portion S2 having the desired length is grown, the crystal diameter is reduced gradually to form an end-cone S3 in order to separate the silicon semiconductor single crystal S from the silicon melt M without adding thermal shock thereto.

After the formation of the end-cone S3 is completed and the silicon semiconductor single crystal S is separated from the silicon melt M, the silicon semiconductor single crystal S is slowly pulled into the upper growth furnace 14 to cool down it therein, and then the operation for growing the silicon semiconductor single crystal S is finished.

During growth of the silicon semiconductor single crystal S, to keep a diameter of the crystal constant and to stabilize quality of the crystal or thermal history imposed upon the silicon semiconductor single crystal S, the crucible driving mechanism 21 is operated so that a surface level of the silicon melt M is kept constant.

Figure 2:
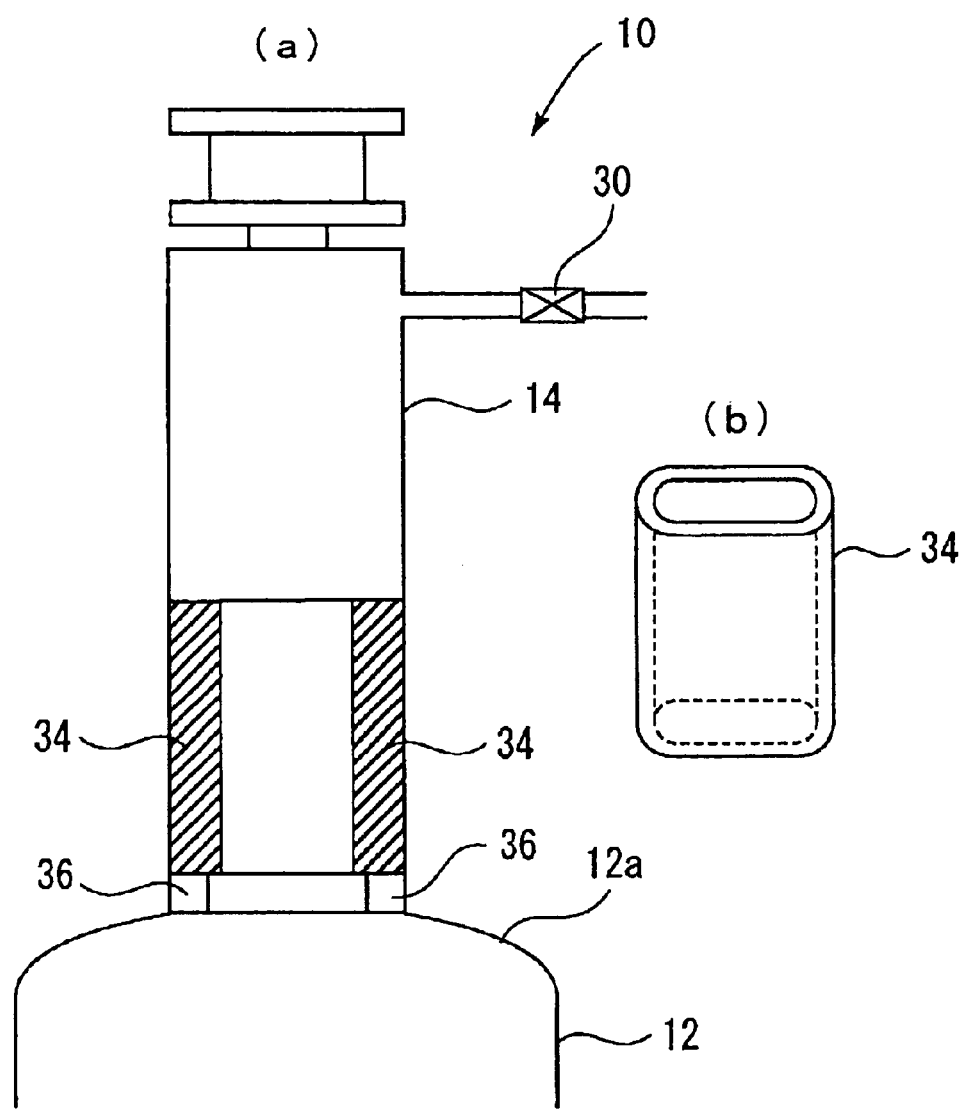
FIG. 2 shows another embodiment of an apparatus for producing a silicon semiconductor single crystal according to the present invention, wherein a part (a) is a schematic cross-sectional explanatory view of an essential part thereof, and a part (b) is a perspective picked out view of an upper insulating member.
Figure 3:
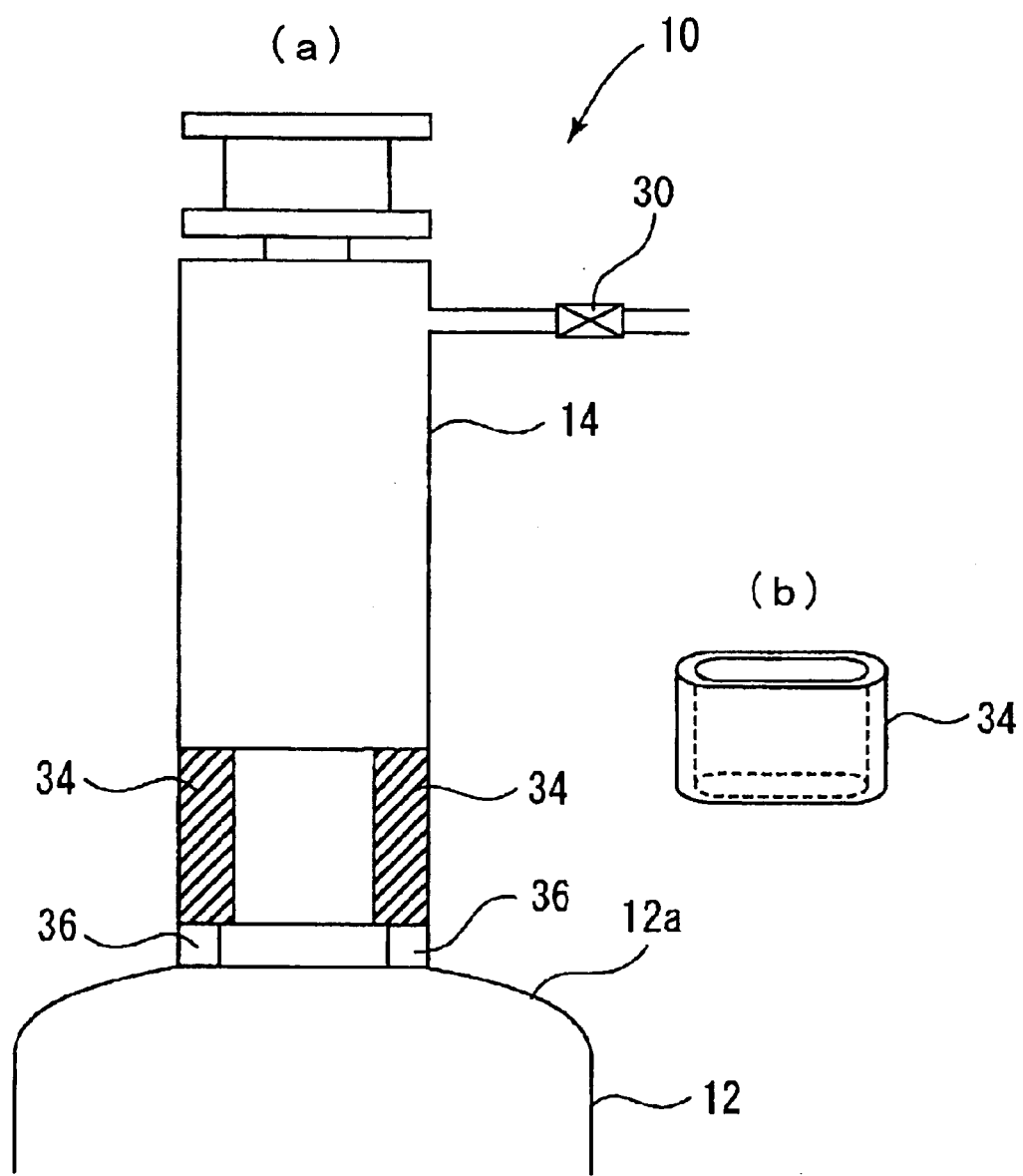
FIG. 3 shows a further embodiment of an apparatus for producing a silicon semiconductor single crystal according to the present invention, wherein a part (a) is a schematic cross-sectional explanatory view of an essential part thereof, and a part (b) is a perspective picked out view of an upper insulating member.

FIG. 2 shows another example of the construction wherein the upper insulating member 34 according to the inventive apparatus is attached to the upper growth furnace 14. In the example shown in FIG. 2, the long upper insulating member 34 is detachably provided on a convex portion 36 arranged in the upper growth section 14. FIG. 3 shows a further example of attachment of the upper insulating member 34 wherein the short upper insulating member 34 is attached via the convex portion 36. With the above described construction, the upper insulating member 34 may be easily exchangeable in compliance with required quality of a silicon semiconductor single crystal S to be grown.

Figure 4:
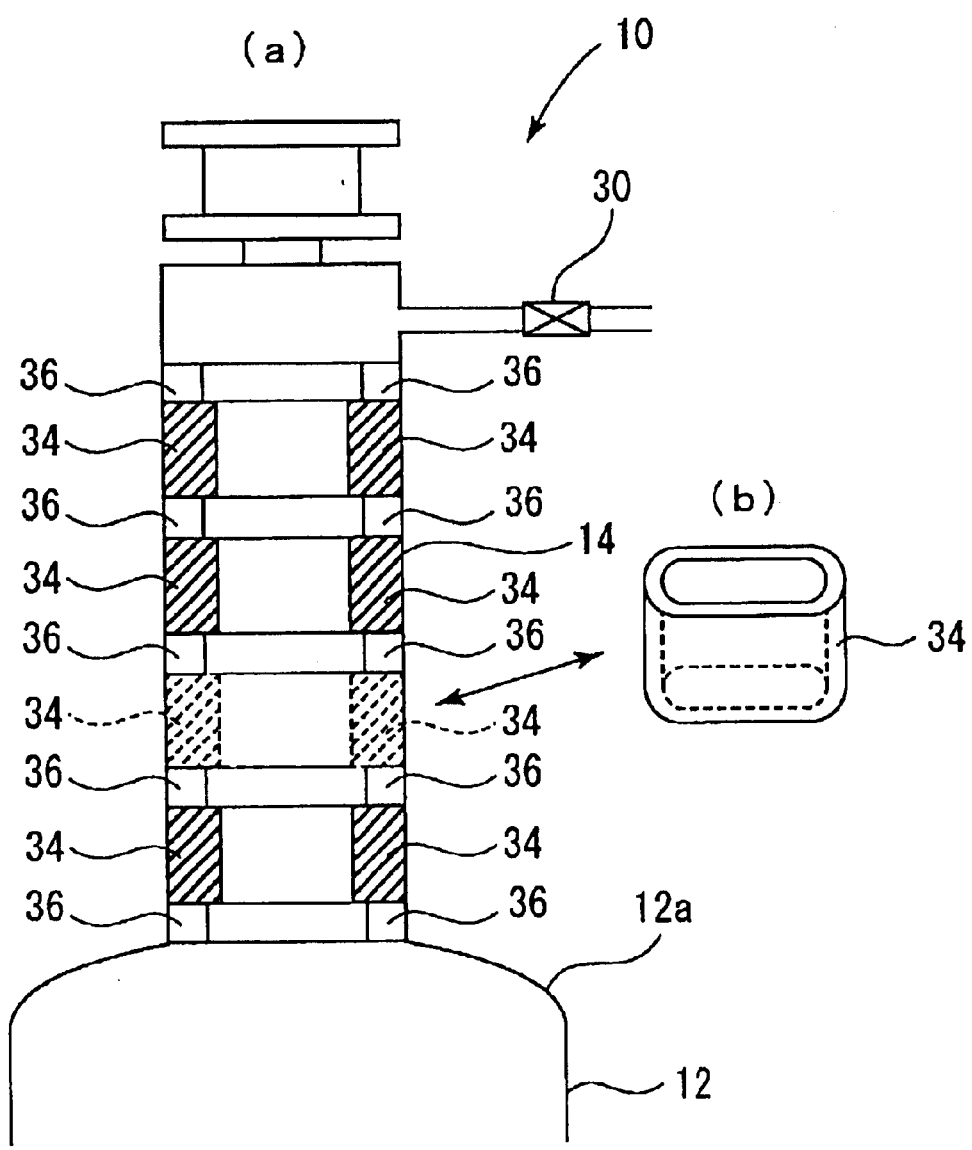
FIG. 4 shows a still further embodiment of an apparatus for producing a silicon semiconductor single crystal according to the present invention, wherein a part (a) is a schematic cross-sectional explanatory view of an essential part thereof, and (b) is a perspective picked out view of an upper insulating member.

FIG. 4 shows a still further example of arrangement of the upper insulating member 34 in the inventive apparatus. In the example shown in FIG. 4, a plurality of upper insulating members 34 (three attached and one removed) are detachably attached to a plurality of convex portions 36 (five in the example shown in the figure) arranged inside the upper growth furnace 14. In this case, by permitting installation and removal of the upper insulating member 34, it is possible to easily change an area to be kept warm in the silicon semiconductor single crystal S housed inside the upper growth furnace 14 or a length of the area to be kept warm in the direction of the crystal growth axis according as the occasion may demand.

With the apparatus construction as shown in FIG. 2 to FIG. 4, a temperature area to be kept warm or a length thereof can be changed freely. It is described in the examples shown in the figures that the form of the upper insulating member 34 is cylindrical. However, it is enough for the form of the upper insulating member 34 to surround the silicon semiconductor single crystal S; there may be used such members as ones formed by dividing a cylindrical body or an almost cylindrical body with a horseshoe-shaped form as viewed from above. It should be noted that in FIG. 2 to FIG. 4, components identical with or similar to those shown in FIG. 1 may be designated by the same reference numerals.

EXAMPLES

The present invention will be described in further details by way of the following examples which should be construed illustrative rather than restrictive.

Experimental Example 1

Figure 5:
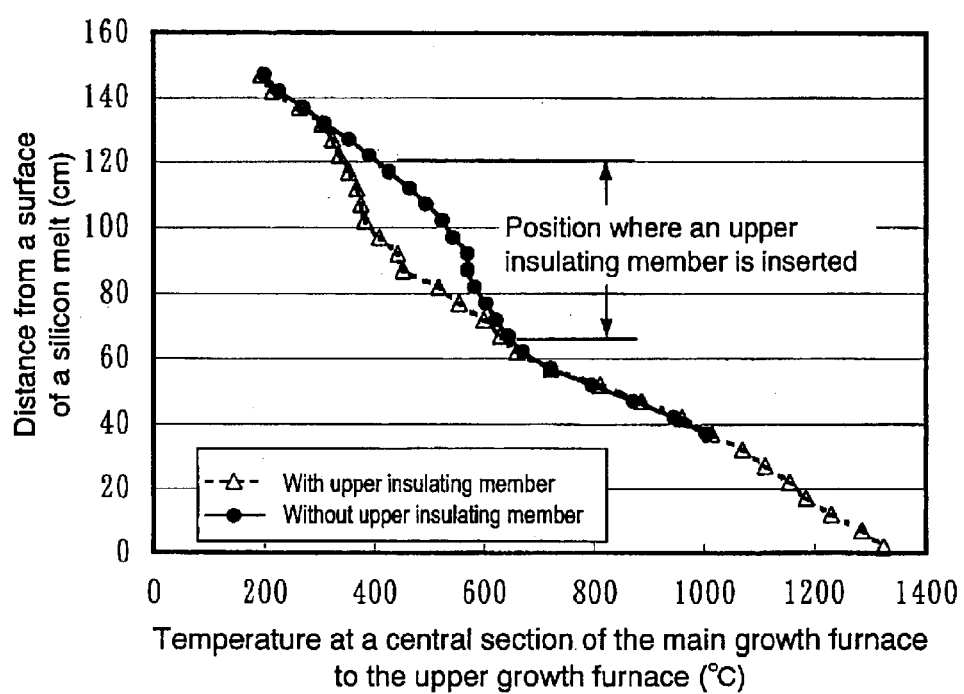
FIG. 5 is a graph showing a relationship between a temperature at a central portion of a main growth surface to an upper growth furnace and a distance from a silicon melt surface in each of Example 1 and Comparative Example 1.

To confirm the keeping warm effect of the upper insulating member 34 provided in the upper growth furnace 14 according to the inventive apparatus, with an apparatus similar to the one shown in FIG. 1, temperature distribution in the direction of the crystal growth axis at the center in the furnace was measured in comparison with that of a normal single crystal producing apparatus not having the upper insulating member 34. The length of the upper insulating member 34 was 50 cm. The results are shown in FIG. 5.

As is apparent from the results of this measurement, it was confirmed that, because of the effect of arranging the insulating member 34 inside the upper growth furnace 14 of the single crystal producing apparatus 10, the temperature distribution is gentle in the relatively low temperature region of the order of 300° C. to 600° C. Therefore, it is understood that, by growing a silicon semiconductor single crystal S using the single crystal producing apparatus 10 according to the present invention, when the silicon semiconductor single crystal S is cooled down, it receives low temperature thermal history longer than the case where the insulating member 34 is not provided in the upper growth furnace 14.

Inventive Example 1

Next, using the inventive single crystal producing apparatus 10 provided with the upper insulating member 34 shown in FIG. 1, a plurality (three) of silicon semiconductor single crystals S were grown.

A quartz crucible 18 with the inside diameter of 55 cm was disposed in the main growth furnace 12 of the single crystal producing apparatus 10, 120 kg of polysilicon was charged in the crucible 18, and the polysilicon was melted by making the heater 20 develop heat to become silicon melt M. Then, after a temperature of the silicon melt M was stabilized, the seed crystal 26 was dipped into a surface of the silicon melt M and then was pulled therefrom to make a silicon semiconductor single crystal S with the constant diameter portion S2 of 100 cm in length and 200 mm in diameter grow under the seed crystal 26. The crystal growth was performed such that the pulling rate of the constant diameter portion S2 of the silicon semiconductor single crystal S stands at 0.9 to 1.0 mm/min; after growth of the silicon semiconductor single crystal S was over, the constant diameter portion S2 of the silicon semiconductor single crystal S was processed into wafers, and an amount of precipitated oxygen at the center of the crystal was measured. The measuring results of three grown silicon semiconductor single crystals are shown in FIG. 6.

Figure 6:
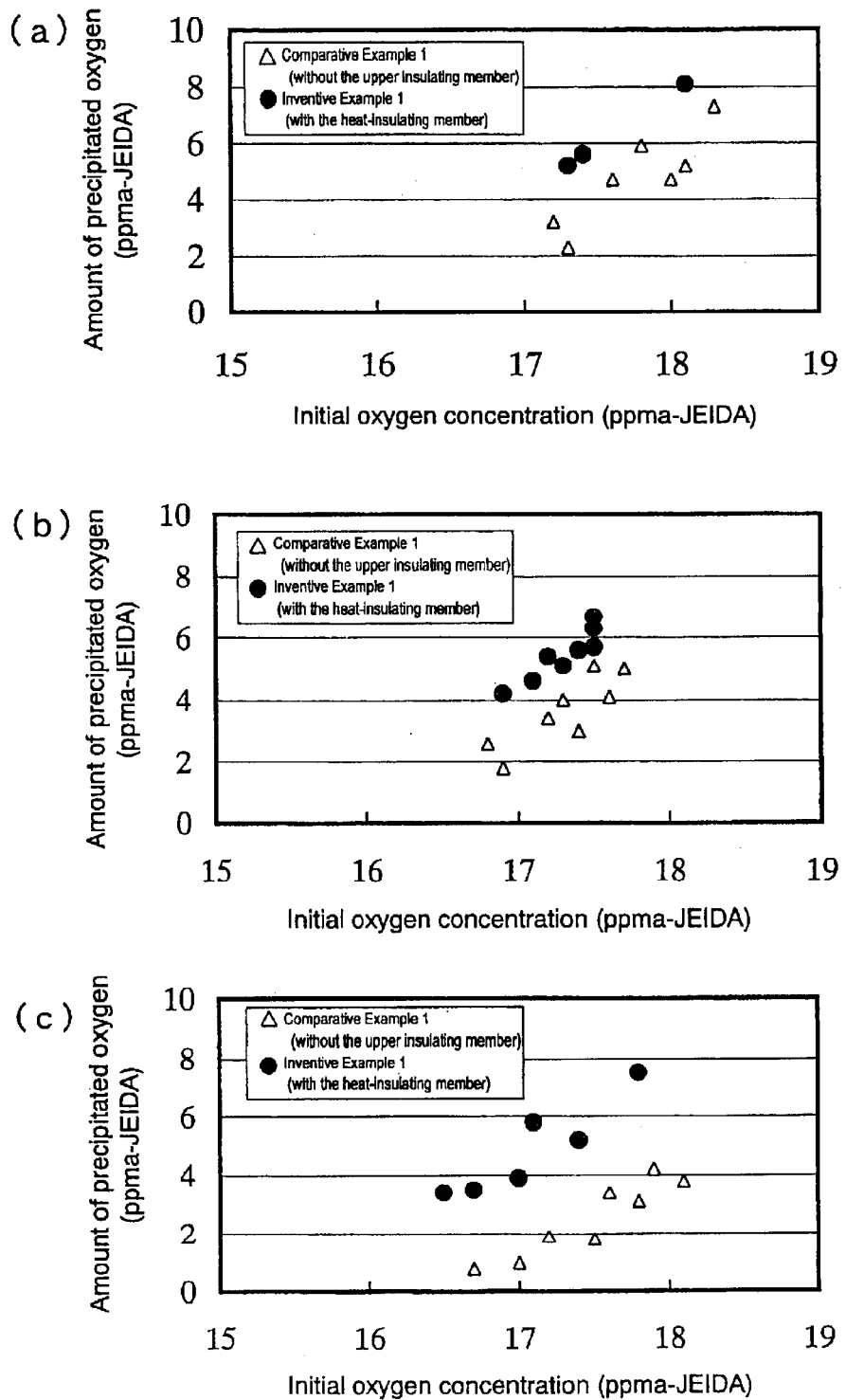
FIG. 6 is graphs each showing a relationship between an initial oxygen concentration and an amount of precipitated oxygen in each of Example 1 and Comparative Example 1, wherein a part (a) is a graph showing a range of from 0 to 25 cm of the constant diameter portion, a part (b) is a graph showing a range of from 25 to 75 cm of the constant diameter portion, and a part (c) is a graph showing a range of 75 cm or more of the constant diameter portion.

In FIG. 6, assuming that the seed crystal side leading edge of the constant diameter portion S2 of the silicon semiconductor single crystal S stands at 0 cm, the area ranging from 0 to 25 cm of the constant diameter portion S2 is defined as the first half section, the area ranging from 25 cm to 75 cm of the constant diameter portion S2 as the middle section, and the area ranging from 75 cm to the terminal edge of the constant diameter portion S2 as the second half section; amounts of precipitated oxygen against the initial oxygen concentrations of the respective silicon semiconductor single crystals S are shown in FIGS. 6($a$), ($b$) and ($c$), respectively.

The conditions for heat treatment applied to the sample wafers for measuring an amount of precipitated oxygen were 600° C. for 180 minutes+1000° C. for 60 minutes+1100° C. for 180 minutes, and the measurement was performed after the heat treatment. An amount of precipitated oxygen was calculated in a manner that the oxygen concentrations before and after the heat treatment were measured by means of infrared absorption spectroscopy, subtracting the value after the heat treatment from that before the heat treatment.

Comparative Example 1

Silicon semiconductor single crystals (three) each with 200 mm in diameter and 100 cm in length of the constant diameter portion were grown under the same conditions as those in Example 1 excluding that the upper insulating member 34 was removed from the upper growth furnace 14 of the single crystal producing apparatus 10 shown in FIG. 1. After growth of the silicon semiconductor single crystal S was over, sample wafers for confirming amounts of precipitated oxygen were sliced from the respective areas of the crystal as in Inventive Example 1; then the wafers were subjected to heat treatment and measured in terms of amounts of precipitated oxygen. The measuring results of three grown silicon semiconductor single crystals are shown in FIG. 6.

In the graphs of FIG. 6, assuming that the seed crystal side leading edge of the constant diameter portion S2 of the silicon semiconductor single crystal S stands at 0 cm, the area ranging from 0 to 25 cm of the constant diameter portion S2 is defined as the first half section, the area ranging from 25 cm to 75 cm of the constant diameter portion S2 as the middle section, and the area ranging from 75 cm to the terminal edge of the constant diameter portion S2 as the second half section; amounts of precipitated oxygen against the initial oxygen concentrations of the respective silicon semiconductor single crystals S are shown in FIGS. 6($a$), ($b$) and ($c$), respectively; the conditions for heat treatment applied to the sample wafers for measuring an amount of precipitated oxygen were 600° C. for 180 minutes+1000° C. for 60 minutes+1100° C. for 180 minutes as in Inventive Example 1.

From the above described results, it is understood that, as compared with the silicon semiconductor single crystal S grown using the single crystal producing apparatus without providing the upper insulating member 34 in the upper growth furnace 14 shown in Comparative Example 1, the amounts of precipitated oxygen over the entire constant diameter section S2 of the silicon semiconductor single crystal grown in Example 1 were more, and that amounts of precipitated oxygen in both the first half section and the second half section are highly homogeneous. Further, it was confirmed that, when the upper insulating member 34 was provided in the upper growth furnace 14, single crystal growth is performed without creation of such problems as slip dislocations occur in the course of growth of the silicon semiconductor single crystal S, and provision of the upper insulating member 34 does not create such troubles as crystal growth is hindered due to loss of heat balance in the single crystal producing apparatus.

Over against this, from the results of Comparative Example 1 it is understood that, as compared with Example 1, the amounts of precipitated oxygen are smaller, the amount of precipitated oxygen in the first half section of the constant diameter section is lower than that in the second half section thereof, and a variation of the amounts of precipitated oxygen in the direction of the crystal growth axis is present. Further, in Comparative Example 1 the amounts of precipitated oxygen themselves stand generally at low values.

It should be noted that the present invention is not limited to the embodiments described above. The embodiments described above are given only for illustrative purposes, and it is needless to say that any type of single crystal producing apparatus having the substantially same construction and the same effect as technical ideas stated in the attached claims should be considered to be within the technical scope of the present invention.

For example, there were described the seed crystal used for growing a silicon semiconductor single crystal and the method for producing the silicon semiconductor single crystal according to the present invention by means of an example of the CZ method in which a silicon semiconductor single crystal is pulled from the silicon melt without applying a magnetic field to the silicon melt, but it is needless to say that the same effect can be obtained in production of silicon semiconductor single crystals by the MCZ method in which a single crystal is grown while applying a magnetic field to the silicon melt.

Capability of Exploitation In Industry:

As described above, when the apparatus for producing a silicon semiconductor single crystal according to the present invention is used for growing a silicon semiconductor single crystal by the CZ method, it is possible to grow a homogeneous silicon semiconductor single crystal with stable distribution of an amount of precipitated oxygen along the full length of the crystal without adding an expensive and complicated apparatus to a silicon semiconductor single crystal producing apparatus, nor introducing an apparatus, for instance, for conducting heat treatment on the grown silicon semiconductor single crystal; it is also possible to manufacture an excellent silicon semiconductor wafer having a small quality variation at low cost and without the need for changing the manufacturing process.

Further, the inventive apparatus has the ability to easily supply silicon semiconductor single crystals with an increased amount of precipitated oxygen as compared with the conventional one; when wafers obtained from the silicon semiconductor single crystals are used for fabricating semiconductor devices, it is possible to increase the device yield and also to improve quality of the semiconductor devices.

What is claimed is:

1. A method for producing a silicon semiconductor single crystal by the Czochralski method, comprising the steps of:
   growing the silicon semiconductor single crystal pulled from a crucible; and
   keeping warm a portion thereof with a temperature of 800° C. or less without heating it from the outside.

2. A method for producing a silicon semiconductor single crystal, comprising the step of:
   producing the silicon semiconductor single crystal by the use of apparatus for producing a silicon semiconductor single crystal including:
   a main growth furnace having a crucible retaining silicon melt disposed therein for growing a silicon semiconductor single crystal; and
   an upper growth furnace for housing therein and cooling the silicon semiconductor single crystal pulled from the silicon melt,
   wherein the upper growth furnace disposed above and communicated to a ceiling section of the main growth furnace is provided with an upper insulating member for surrounding a pulled silicon semiconductor single crystal.

3. A method for producing a silicon semiconductor single crystal according to claim 2, wherein a length in a direction along the crystal growth axis of the upper insulating member provided in the upper growth furnace ranges between one-twentieth of the full length of the upper growth furnace and the full length of the upper growth furnace.

4. A method for producing a silicon semiconductor single crystal according to claim 2, wherein the upper insulating member provided in the upper growth furnace is provided at a position where a temperature inside the upper growth furnace is 800° C. or less.

5. A method for producing a silicon semiconductor single crystal according to claim 2 wherein the upper insulating member provided in the upper growth furnace is provided at a position where a temperature inside the upper growth furnace is in the range from 400° C. to 650° C.

6. An apparatus for producing a silicon semiconductor single crystal by the Czochralski method comprising:
   a main growth furnace having a crucible retaining silicon melt disposed therein for growing a silicon semiconductor single crystal; and
   an upper growth furnace for housing therein and cooling the silicon semiconductor single crystal pulled from the silicon melt,
   wherein the upper growth furnace disposed above and communicated to a ceiling section of the main growth furnace is provided with an upper insulating member for surrounding a pulled silicon semiconductor single crystal.

7. The apparatus for producing a silicon semiconductor single crystal according to claim 6, wherein a length in a direction along the crystal growth axis of the upper insulating member provided in the upper growth furnace ranges between one-twentieth of the full length of the upper growth furnace and the full length of the upper growth furnace.

8. The apparatus for producing a silicon semiconductor single crystal according to claim 7, wherein a surface of the upper insulating member provided in the upper growth furnace is covered with high purity graphite materials or high purity graphite materials with a surface coated with a film of pyrolytic carbon or silicon carbide.

9. The apparatus for producing a silicon semiconductor single crystal according to claim 6, wherein a surface of the upper insulating member provided in the upper growth furnace is covered with high purity graphite materials or high purity graphite materials with a surface coated with a film of pyrolytic carbon or silicon carbide.

10. An apparatus for producing a silicon semiconductor single crystal by the Czochralski method comprising:
    a main growth furnace having a crucible retaining silicon melt disposed therein for growing a silicon semiconductor single crystal; and
    an upper growth furnace for housing therein and cooling the silicon semiconductor single crystal pulled from the silicon melt,
    wherein the upper growth furnace communicated to a ceiling section of the main growth furnace is provided with an upper insulating member for surrounding a pulled silicon semiconductor single crystal and wherein the upper insulating member provided in the upper growth furnace is provided at a position where a temperature inside the upper growth furnace is 800° C. or less.

11. The apparatus for producing a silicon semiconductor single crystal according to claim 10, wherein the upper insulating member provided in the upper growth furnace is provided at a position where a temperature inside the upper growth furnace is in the range from 400° C. to 650° C.

12. The apparatus for producing a silicon semiconductor single crystal according to claim 11, wherein the upper insulating member provided in the upper growth furnace is made of materials obtained by shaping carbon fiber.

13. The apparatus for producing a silicon semiconductor single crystal according to claim 11, wherein a surface of the upper insulating member provided in the upper growth furnace is covered with high purity graphite materials or high purity graphite materials with a surface coated with a film of pyrolytic carbon or silicon carbide.

14. The apparatus for producing a silicon semiconductor single crystal according to claim 11, wherein a surface of the upper insulating member provided in the upper growth furnace is covered with metallic materials containing a metal selected from the group consisting of iron, nickel, chromium, copper, titanium, tungsten, and molybdenum as the main ingredient.

15. The apparatus for producing a silicon semiconductor single crystal according to claim 11, wherein the upper insulating member provided in the upper growth furnace is exchangeable in compliance with a selected cooling thermal history of a silicon semiconductor single crystal.

16. The apparatus for producing a silicon semiconductor single crystal according to claim 11, wherein a plurality of the upper insulating members are provided along the silicon semiconductor single crystal growth axis in the upper growth furnace and the number of the upper insulating members provided along the silicon semiconductor single crystal growth axis is adjustable in compliance with a selected cooling thermal history of the silicon semiconductor single crystal.

17. The apparatus for producing a silicon semiconductor single crystal according to claim 10, wherein the upper insulating member provided in the upper growth furnace is made of materials obtained by shaping carbon fiber.

18. The apparatus for producing a silicon semiconductor single crystal according to claim 10, wherein a surface of the upper insulating member provided in the upper growth furnace is covered with high purity graphite materials or high purity graphite materials with a surface coated with a film of pyrolytic carbon or silicon carbide.

19. The apparatus for producing a silicon semiconductor single crystal according to claim 10, wherein a surface of the upper insulating member provided in the upper growth furnace is covered with metallic materials containing a metal selected from the group consisting of iron, nickel, chromium, copper, titanium, tungsten, and molybdenum as the main ingredient.

20. The apparatus for producing a silicon semiconductor single crystal according to claim 10, wherein the upper insulating member provided in the upper growth furnace is exchangeable in compliance with a selected cooling thermal history of a silicon semiconductor single crystal.

21. The apparatus for producing a silicon semiconductor single crystal according to claim 10, wherein a plurality of the upper insulating members are provided along the silicon semiconductor single crystal growth axis in the upper growth furnace and the number of the upper insulating members provided along the silicon semiconductor single crystal growth axis is adjustable in compliance with a selected cooling thermal history of the silicon semiconductor single crystal.

22. An apparatus for producing a silicon semiconductor single crystal by the Czochralski method comprising:
a main growth furnace having a crucible retaining silicon melt disposed therein for growing a silicon semiconductor single crystal; and
an upper growth furnace for housing therein and cooling the silicon semiconductor single crystal pulled from the silicon melt,
wherein the upper growth furnace communicated to a ceiling section of the main growth furnace is provided with an upper insulating member for surrounding a pulled silicon semiconductor single crystal and wherein the upper insulating member provided in the upper growth furnace is made of materials obtained by shaping carbon fiber.

23. An apparatus for producing a silicon semiconductor single crystal by the Czochralski method comprising:
a main growth furnace having a crucible retaining silicon melt disposed therein for growing a silicon semiconductor single crystal; and
an upper growth furnace for housing therein and cooling the silicon semiconductor single crystal pulled from the silicon melt,
wherein the upper growth furnace communicated to a ceiling section of the main growth furnace is provided with an upper insulating member for surrounding a pulled silicon semiconductor single crystal, wherein a length in a direction along the crystal growth axis of the upper insulating member provided in the upper growth furnace ranges between one-twentieth of the full length of the upper growth furnace and the full length of the upper growth furnace and wherein the upper insulating member provided in the upper growth furnace is made of materials obtained by shaping carbon fiber.

24. An apparatus for producing a silicon semiconductor single crystal by the Czochralski method comprising:
a main growth furnace having a crucible retaining silicon melt disposed wherein for growing a silicon semiconductor single crystal; and
an upper growth furnace for housing therein and cooling the silicon semiconductor single crystal pulled from the silicon melt,
wherein the upper growth furnace communicated to a ceiling section of the main growth furnace is provided with an upper insulating member for surrounding a pulled silicon semiconductor single crystal and wherein a surface of the upper insulating member provided in the upper growth furnace is covered with metallic materials containing a metal selected from the group consisting of iron, nickel, chromium, copper, titanium, tungsten, and molybdenum as the main ingredient.

25. An apparatus for producing a silicon semiconductor single crystal by the Czochralski method comprising:
a main growth furnace having a crucible retaining silicon melt disposed therein for growing a silicon semiconductor single crystal; and
an upper growth furnace for housing therein and cooling the silicon semiconductor single crystal pulled from the silicon melt,
wherein the upper growth furnace communicated to a ceiling section of the main growth furnace is provided with an upper insulating member for surrounding a pulled silicon semiconductor single crystal, wherein a length in a direction along the crystal growth axis of the upper insulating member provided in the upper growth furnace ranges between one-twentieth of the full length of the upper growth furnace and the full length of the upper growth furnace and wherein a surface of the upper insulating member provided in the upper growth furnace is covered with metallic materials containing a metal selected from the group consisting of iron, nickel, chromium, copper, titanium, tungsten, and molybdenum as the main ingredient.

26. An apparatus for producing a silicon semiconductor single crystal by the Czochralski method comprising:
a main growth furnace having a crucible retaining silicon melt disposed therein for growing a silicon semiconductor single crystal; and
an upper growth furnace for housing therein and cooling the silicon semiconductor single crystal pulled from the silicon melt,
wherein the upper growth furnace communicated to a ceiling section of the main growth furnace is provided with an upper insulating member for surrounding a pulled silicon semiconductor single crystal and wherein the upper insulating member provided in the upper growth furnace is exchangeable in compliance with a selected cooling thermal history of a silicon semiconductor single crystal.

27. An apparatus for producing a silicon semiconductor single crystal by the Czochralski method comprising:
a main growth furnace having a crucible retaining silicon melt disposed therein for growing a silicon semiconductor single crystal; and
an upper growth furnace for housing therein and cooling the silicon semiconductor single crystal pulled from the silicon melt,
wherein the upper growth furnace communicated to a ceiling section of the main growth furnace is provided with an upper insulating member for surrounding a pulled silicon semiconductor single crystal, wherein a length in a direction along the crystal growth axis of the upper insulating member provided in the upper growth furnace ranges between one-twentieth of the full length of the upper growth furnace and the full length of the upper growth furnace and wherein the upper insulating member provided in the upper growth furnace is exchangeable in compliance with a selected cooling thermal history of a silicon semiconductor single crystal.

28. An apparatus for producing a silicon semiconductor single crystal by the Czochralski method comprising:

a main growth furnace having a crucible retaining silicon melt disposed therein for growing a silicon semiconductor single crystal; and an upper growth furnace for housing therein and cooling the silicon semiconductor single crystal pulled from the silicon melt, wherein the upper growth furnace communicated to a ceiling section of the main growth furnace is provided with an upper insulating member for surrounding a pulled silicon semiconductor single crystal and wherein a plurality of the upper insulating members are provided along the silicon semiconductor single crystal growth axis in the upper growth furnace and the number of the upper insulating members provided along the silicon semiconductor single crystal growth axis is adjustable in compliance a selected cooling thermal history of the silicon semiconductor single crystal.

29. An apparatus for producing a silicon semiconductor single crystal by the Czochralski method comprising:

a main growth furnace having a crucible retaining silicon melt disposed therein for growing a silicon semiconductor single crystal; and an upper growth furnace for housing therein and cooling the silicon semiconductor single crystal pulled from the silicon melt, wherein the upper growth furnace communicated to a ceiling section of the main growth furnace is provided with an upper insulating member for surrounding a pulled silicon semiconductor single crystal, wherein a length in a direction along the crystal growth axis of the upper insulating member provided in the upper growth furnace ranges between one-twentieth of the full length of the upper growth furnace and the full length of the upper growth furnace and wherein a plurality of the upper insulating members are provided along the silicon semiconductor single crystal growth axis in the upper growth furnace and the number of the upper insulating members provided along the silicon semiconductor single crystal growth axis is adjustable in compliance with a selected cooling thermal history of the silicon semiconductor single crystal.

* * * * *